(12) United States Patent
Liang et al.

(10) Patent No.: US 10,748,967 B2
(45) Date of Patent: Aug. 18, 2020

(54) IMAGE SENSORS WITH ORGANIC PHOTODIODES AND METHODS FOR FORMING THE SAME

(71) Applicant: Taiwan Semiconductor Manufacturing Company, Ltd., Hsinchu (TW)

(72) Inventors: Chin-Wei Liang, Zhubei (TW);
Chia-Shiung Tsai, Hsinchu (TW);
Cheng-Yuan Tsai, Chu-Pei (TW);
Hsing-Lien Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/017,707

(22) Filed: Jun. 25, 2018

(65) Prior Publication Data
US 2018/0308901 A1    Oct. 25, 2018

Related U.S. Application Data

(63) Continuation of application No. 15/242,220, filed on Aug. 19, 2016, now Pat. No. 10,008,546, which is a
(Continued)

(51) Int. Cl.
*H01L 27/30* (2006.01)
*H01L 27/146* (2006.01)
*H01L 51/10* (2006.01)

(52) U.S. Cl.
CPC ...... *H01L 27/307* (2013.01); *H01L 27/14621* (2013.01); *H01L 27/14627* (2013.01);
(Continued)

(58) Field of Classification Search
CPC ............ H01L 27/307; H01L 27/14621; H01L 27/14627; H01L 27/14665; H01L 51/107; H01L 2924/15159; H01L 2924/15162
See application file for complete search history.

(56) References Cited

U.S. PATENT DOCUMENTS

| | | | |
|---|---|---|---|
| 5,831,305 A | 11/1998 | Kim | |
| 7,265,378 B2 * | 9/2007 | Lecloux | ............... C07C 211/49 257/40 |

(Continued)

FOREIGN PATENT DOCUMENTS

| | | | |
|---|---|---|---|
| JP | 2007142386 | | 6/2007 |
| JP | 2010-199101 | * | 9/2010 |

(Continued)

OTHER PUBLICATIONS

Baierl, Daniela, et al., "A Hybrid CMOS-Imager with a Solution-Processable Polymer as Photoactive Layer", Nature Communications, Nov. 6, 2012 Macmillian Publishers, Limited, pp. 1-8.

(Continued)

*Primary Examiner* — Patricia D Reddington
(74) *Attorney, Agent, or Firm* — Slater Matsil, LLP

(57) ABSTRACT

Embodiments of forming an image sensor with organic photodiodes are provided. Trenches are formed in the organic photodiodes to increase the PN junction interfacial area, which improves the quantum efficiency (QE) of the photodiodes. The organic P-type material is applied in liquid form to fill the trenches. A mixture of P-type materials with different work function values and thickness can be used to meet the desired work function value for the photodiodes.

20 Claims, 8 Drawing Sheets

Related U.S. Application Data continuation of application No. 14/012,713, filed on Aug. 28, 2013, now Pat. No. 9,425,240.

(52) U.S. Cl.
CPC ...... *H01L 27/14665* (2013.01); *H01L 51/107* (2013.01); *H01L 2924/15159* (2013.01); *H01L 2924/15162* (2013.01)

(56) References Cited

U.S. PATENT DOCUMENTS

| | | | |
|---|---|---|---|
| 2007/0111368 A1 | 5/2007 | Zhang et al. | |
| 2009/0065828 A1 | 3/2009 | Hwang | |
| 2010/0047947 A1* | 2/2010 | Yashima | H01S 5/223 438/40 |
| 2011/0269264 A1* | 11/2011 | Korevaar | H01L 31/022425 438/98 |
| 2012/0038014 A1* | 2/2012 | Tai | H01L 27/14638 257/437 |

FOREIGN PATENT DOCUMENTS

| | | | |
|---|---|---|---|
| JP | 2010199101 | | 9/2010 |
| JP | 2011-35243 | * | 2/2011 |
| JP | 2011035243 | | 2/2011 |
| KR | 1020060077577 | | 7/2006 |
| KR | 20110093044 A | | 8/2011 |

OTHER PUBLICATIONS

Gunes, Serap, et al., "Conjugated Polymer-Based Organic Solar Cells" Chem, Rev. 2007, 107, 1324-1338.

* cited by examiner

IMAGE SENSORS WITH ORGANIC PHOTODIODES AND METHODS FOR FORMING THE SAME

PRIORITY CLAIM AND CROSS-REFERENCE

This application is a continuation of U.S. application Ser. No. 15/242,220, filed on Aug. 19, 2016, which is a continuation of U.S. application Ser. No. 14/012,713, filed on Aug. 28, 2013, now U.S. Pat. No. 9,425,240, which applications are hereby incorporated herein by reference.

The present application is related to U.S. application Ser. No. 14/012,789, entitled "Organic Photodiode with Dual Electron-Blocking Layers," and U.S. application Ser. No. 14/012,692, entitled "Organic Photosensitive Device with an Electron-Blocking and Hole-Transport Layer." Both above-mentioned applications are incorporated herein by reference in their entireties.

BACKGROUND

Image sensor chips, which include front side illumination (FSI) image sensor chips and Backside Illumination (BSI) image sensor chips, are widely used in applications such as cameras. In the formation of image sensor chips, image sensors (such as photo diodes) and logic circuits are formed on a silicon substrate (or a wafer), followed by the formation of an interconnect structure on a front side of the wafer. In the front side image sensor chips, color filters and micro-lenses are formed over the interconnector structure. In the formation of the BSI image sensor chips, after the formation of the interconnect structure, the wafer is thinned, and backside structures such as color filters and micro-lenses are formed on the backside of the silicon substrate. When the image sensor chips are used, light is projected on the image sensors, in which the light is converted into electrical signals.

The image sensors in the image sensor chips generate electrical signals in response to the stimulation by photons. Quantum efficiency (QE) of a photosensitive device measures a percentage of photons hitting a device's photoreactive surface that produce charge carriers.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

Figure 1:
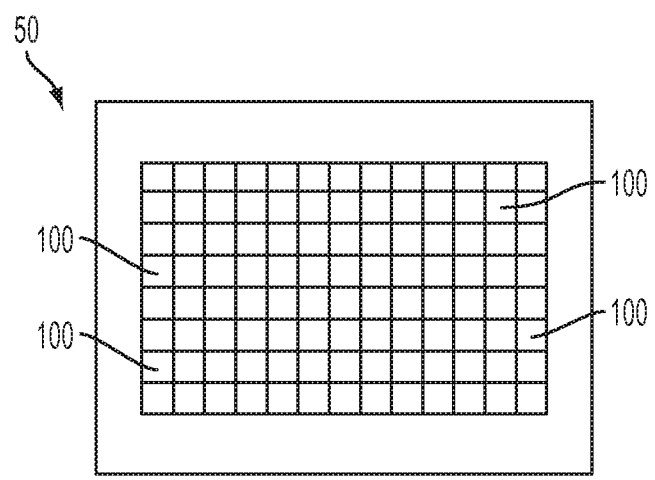
FIG. 1 is a top view of an image sensor, in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an image sensor 50 provides a grid of front side illuminated (or front-illuminated) pixels 100, in accordance with some embodiments. In at least the present embodiment, the pixels 100 are photosensitive diodes or photodiodes, for recording an intensity or brightness of light on the diode. The pixels 100 include reset transistors, source follower transistors, and transfer transistors, etc., in some embodiments. In some embodiments, the image sensor 50 includes a charge-coupled device (CCD), a complimentary metal oxide semiconductor (CMOS) image sensor (CIS), an active-pixel sensor (ACP), or a passive-pixel sensor. In some embodiments, organic photodetectors (sensors of light) made with organic semiconductor materials (non-silicon based material) are used due to low manufacturing cost. Such organic semiconductor materials are able to be easily integrated with CMOS process technology. Additional devices and circuitry are typically provided adjacent to the grid of pixels 100 for providing an operation environment for the pixels and for supporting external communications with the pixels. In some embodiments, the additional devices and circuitry are made by CMOS process technology. As a result, image sensors using organic photodetectors with CMOS process technology are called hybrid CMOS image sensors.

As mentioned above, organic semiconductor materials are attractive due to low manufacturing cost. However, the existing image sensors using organic semiconductor materials either have low quantum efficiency (QE) or high dark current. As a result, there is a need for image sensors using organic semiconductor materials with high QE and low dark current.

Figure 2:
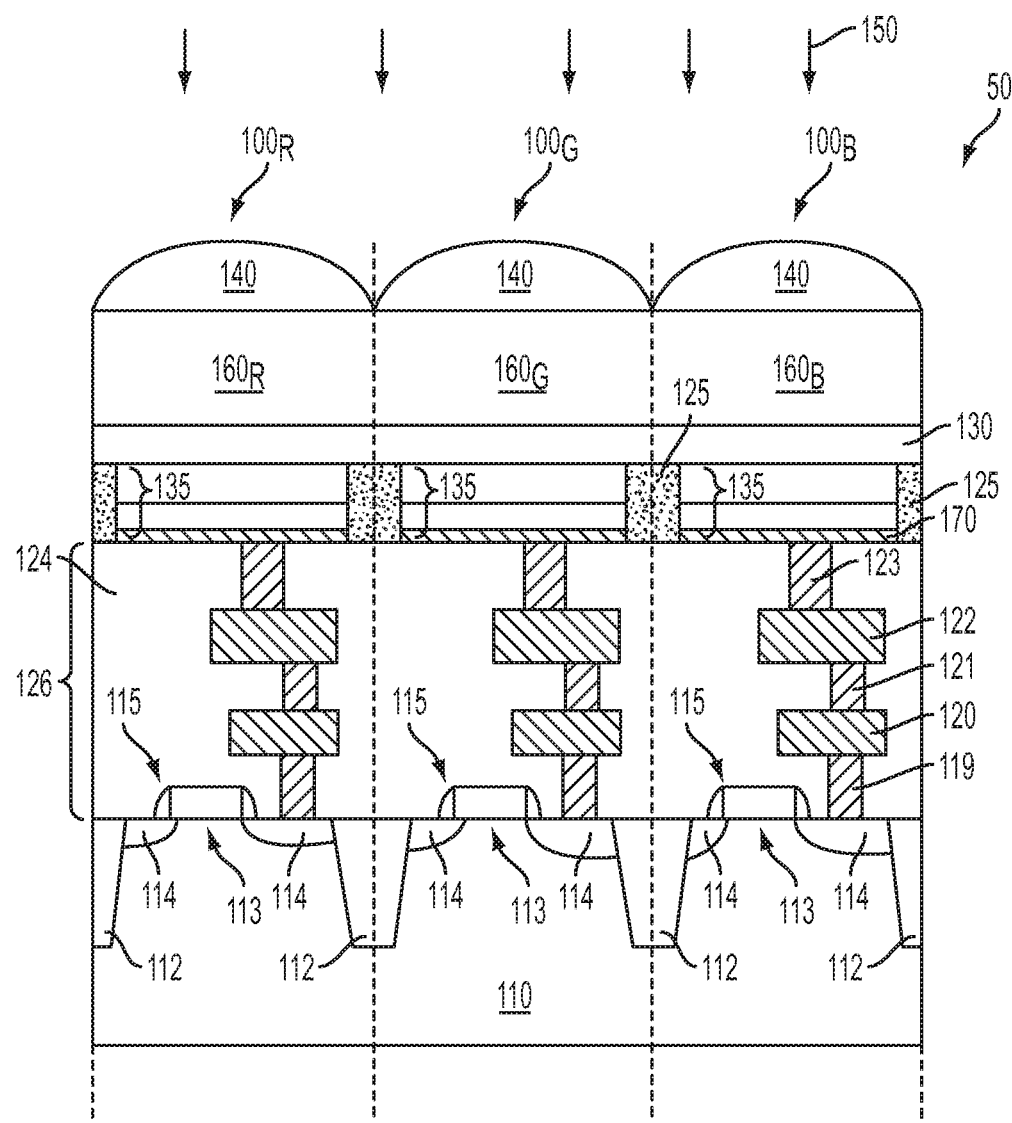
FIG. 2 is a cross-sectional view of the image sensor of FIG. 1, in accordance with some embodiments.

FIG. 2 is a cross-sectional view of image sensor 50, in accordance with some embodiments. Sensor 50 includes a silicon substrate 110, in accordance with some embodiments. In some embodiments, the substrate no comprises an elementary semiconductor such as silicon, germanium, or diamond. In some embodiments, the substrate no comprises a compound semiconductor such as silicon carbide, gallium arsenic, indium arsenide, or indium phosphide. Also, semiconductor arrangements such as silicon-on-insulator and/or an epitaxial layer are provided, in some embodiments. In some embodiments, the substrate 110 comprises an alloy semiconductor such as silicon germanium, silicon germanium carbide, gallium arsenic phosphide, or gallium indium phosphide. In at least the present embodiment, the substrate 110 comprises P-type silicon. All doping is able to be implemented using a process such as ion implantation or diffusion in various steps.

The image sensor 50 includes a plurality of pixels 100, such as 100R, 100G, and 100B, formed on the front surface of the semiconductor substrate 110. For the sake of example, the pixels shown in FIG. 2 are further labeled 100R, 100G, and 100B to correspond with example light wavelengths of red, green, and blue, respectively.

The image sensor 50 further includes an interconnect structure 126, which includes additional layers, such as first and second metal layers 120, 122, contacts/vias 119, 121, 123 and inter-level dielectric (ILD) 124. The metal layers and contacts/vias are formed by single or dual damascene process, in some embodiments. If the metal layers and contacts/vias are formed by dual damascene process, a metal layer, such as layer 122, and corresponding vias, such as vias 121, are formed by a deposition process, such as a plating process. Contacts 119 connect first metal layer 120 with device structures 115. FIG. 2 indicates that contacts 119 connect to source/drain regions 114 of device structures 115. However, contacts 119 may also connect to gate structures 113. Vias 123 connect interconnect of device structures 115 with a pixel electrode layer 170, which are part of pixels 100. Device structures 115 in different pixels 100 are separated by isolation structures 112, such as shallow trench isolation (STI) structures.

The ILD 124 includes multiple layers of dielectric films, which include one or more low-k materials. Low-k materials have a lower dielectric constant than a dielectric constant of silicon dioxide. In some embodiments, ILD 124 includes carbon-doped silicon oxide, fluorine-doped silicon oxide, silicon oxide, silicon nitride, organic low-k material, or combinations thereof. In some embodiments, the conductive material(s) of metal layers, such as 120 and 122, and contacts/vias 119, 121 and 123 include aluminum, aluminum alloy, copper, copper alloy, tungsten, titanium, titanium nitride, tantalum, tantalum nitride, metal silicide, tungsten or combinations thereof.

Additional circuitry also exists to provide appropriate functionality to handle a type of pixels 100 being used and a type of light being sensed. One of ordinary skill would understand that the wavelengths red, green, and blue are provided for the sake of example only, and that the pixels 100 include photodiodes 135 as photosensors. Photodiodes 135 uses organic semiconductor materials, in some embodiments. Details of material layers used in forming organic photodiodes 135 are described below.

In some embodiments, there are light-blocking structures 125 between pixels 100. Light-blocking structures 125 block the transmission of light from neighboring color filters 160 and reduce cross-talk between pixels 100.

The image sensor 50 is designed to receive light 150 directed towards a front surface of the semiconductor substrate 110 during operation, eliminating obstructions to the optical paths by other objects such as gate features and metal lines, and maximizing the exposure of a light-sensing region to an illuminated light. The illuminated light 150 is not limited to visual light beam, and is able to include infrared (IR), ultraviolet (UV), or other proper radiation beam.

The image sensor 50 further includes a color filter layer 160 over a passivation layer 130. The passivation layer 130 protects the pixels 100 from being damaged during formation of color filters, such as 160R, 160G, and 160B, and micro-lenses 140. In some embodiments, passivation layer 130 is made of a dielectric material, such as silicon oxide, silicon nitride, silicon oxynitride, polymers, such as polyimide, polybenzoxazole (PBO), or benzocyclobutene (BCB), or combinations thereof. The color filter layer 160 is able to support several different color filters (e.g., red, green, and blue), and are positioned such that the incident light is directed thereon and there through. In at least one embodiment, such color filters 160R, 160G, and 160B comprise a polymeric material (e.g., negative photoresist based on an acrylic polymer) or resin. In some embodiments, the color filter layer 160 includes a negative photoresist based on an acrylic polymer including color pigments. In some embodiments, color filters 160R, 160G, and 160B correspond to pixels 100R, 100G, and 100B, respectively.

The image sensor 50 includes a number of micro-lens 140 formed over color filters 160R, 160G, and 160B. Micro-lens 140 focus illuminated light 150 toward pixels 100R, 100G, and 100B.

Figure 3:
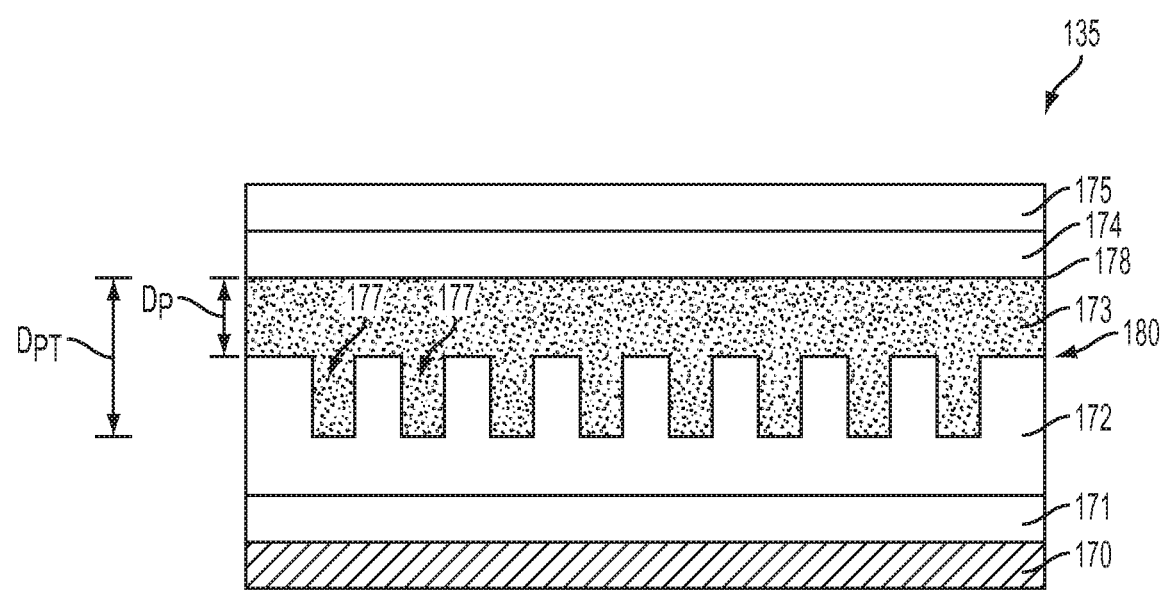
FIG. 3 is a cross-sectional view of a photodiode, in accordance with some embodiments.

FIG. 3 is a cross-sectional view of a photodiode 135, in accordance with some embodiments. Each photodiode 135 has two electrodes. Photodiode 135 includes a pixel electrode layer 170, which is made of a conductive material and is formed over interconnect structures 126, as shown in FIG. 2. Pixel electrode layer 170 forms a cathode of the photodiode of pixel 100. A work function of the electrode layer 170 is less than about 4.5 eV, in some embodiments. In some embodiments, pixel electrode layer 170 includes Ag, Al, Ca, Mg, or other applicable conductive materials. In some embodiments, a thickness of electrode layer 170 is in a range from about 50 nm to about 500 nm. The work function of pixel electrode layer 170 can be tuned, by choosing a material and by varying the thickness. In some embodiments, the pixel electrode layer 170 is deposited by physical vapor deposition (PVD). However, other deposition method, such as chemical vapor deposition (CVD) or atomic layer deposition (ALD), are also possible.

An electron transport layer 171 is formed over pixel electrode layer 170, in some embodiments. The electron transport layer 171 provides a work function that assists transport of electron and blocks transport of holes. Therefore, electron transport layer 171 is also called a hole blocking layer. In some embodiments, the work function of the electron transport layer 171 has a range of work function values. A highest work function value is called highest occupied molecular orbital (HOMO) and a lowest work function value is called lowest occupied molecular orbital (LUMO). In some embodiments, the LUMO of electron transport layer 171 is in a range from about 2.8 eV to about 4.5 eV and the HOMO of electron transport layer 171 is in a range from about 6.1 eV to about 7.8 eV. In some embodiments, electron transport layer 171 is made of LiF, TiO2, ZnO, Ta2O5, ZrO2, or other applicable conductive materials. The work function of electron transport layer 171 is able to be tuned, by choosing the material and by varying the thickness. Electron transport layer 171 is omitted in some embodiments. In some embodiments, the electron transport layer 171 is deposited by physical vapor deposition (PVD). However, other deposition method, such as chemical vapor deposition (CVD) or atomic layer deposition (ALD), are possible.

Afterwards, an N-type layer 172 is deposited over electron transport layer 171, or electrode layer 170, if electron transport layer 171 is not present. The N-type layer 172 and a subsequent P-type layer, which is to be described below, form P-N junction photodiodes. In some embodiments, the N-type layer 172 is made of a metal oxide, such as ZnO, TiO2, or other suitable metal oxide materials. In some embodiments, the LUMO of N-type layer 172 is in a range from about 3.7 eV to about 4.5 eV and the HOMO of N-type layer 172 is in a range from about 6.7 eV to about 7.8 eV.

A thickness TT of the N-type layer 172 is in a range from about 50 nm to about 300 nm, in accordance with some embodiments. Similarly, the work function of N-type layer 172 can be tuned, by choosing the material and by varying the thickness. In some embodiments, the N-type layer 172 is deposited by physical vapor deposition (PVD). However, other deposition method, such as chemical vapor deposition (CVD) or atomic layer deposition (ALD), are also possible.

The N-type layer 172 is then patterned to form trenches 177 to increase a surface area of the N-type layer 172, which increases the interfacial area of P-N junctions of the photodiode 135. As mentioned above, quantum efficiency (QE) of a photosensitive device measures the percentage of photons hitting a device's photoreactive surface that produces charge carriers. Photodiodes with large PN junction interfacial area enable to more effectively convert photons hitting the diodes into charge carriers. As a result, QE is increased by the inclusion of trenches 177. In some embodiments, the QE is improved in a range from about 20% to about 200%, as compared to photodiodes with flat surfaces, which has lower PN junction interfacial area.

Figure 4A:
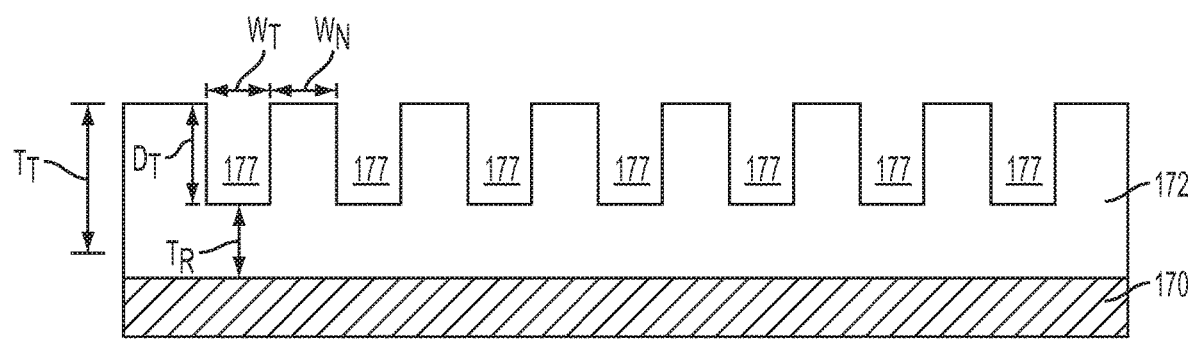
FIG. 4A is a cross-sectional view of an N-type layer formed over an electrode layer, in accordance with some embodiments.

FIG. 4A is a cross-sectional view of a patterned N-type layer 172 formed over pixel electrode layer 170, in accordance with some embodiments. As mentioned above, trenches 177 are formed in layer 172. Trenches 177 have widths WT in a range from about 10 nm to about 200 nm, in some embodiments. The widths WT of different trenches 177 are equal in some embodiments. However, the widths WT of at least one trench 177 is different from at least one other trench 177, in some embodiments. The width WN of the N-type layer 172 between two neighboring trenches 177 is in a range from about 10 nm to about 200 nm in some embodiments. The depths DT of trenches 177 are in a range from about 10 nm to about 290 nm. The depths DT of different trenches 177 are equal in some embodiments. However, the depth DT of at least one trench 177 is different from at least one other trench 177, in some embodiments. A total thickness TT of the N-type layer 172 is in a range from about 50 nm to about 300 nm, in some embodiments. A remaining thickness TR of N-type layer 172 below bottoms of trenches 177 to the surface of layer 170 is in a range from about 10 nm to about 290 nm, in some embodiments. The trenches 177 are formed by first patterning the surface of layer 172 with a photoresist layer (not shown) and then using an etch process to remove N-type layer 172 not covered by the photoresist layer.

Figure 4B:
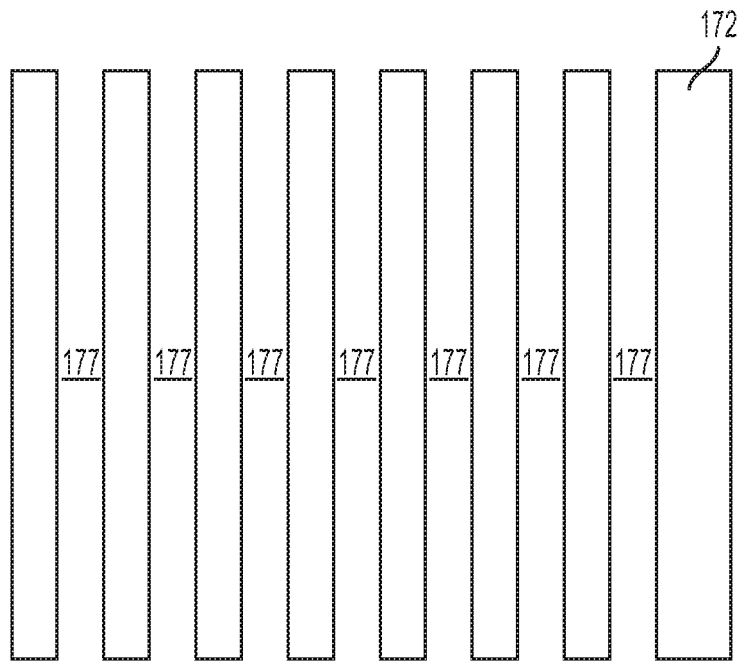
FIGS. 4B and 4C are top views of a patterned N-type layer of FIG. 4A, in accordance with some embodiments.
Figure 4C:
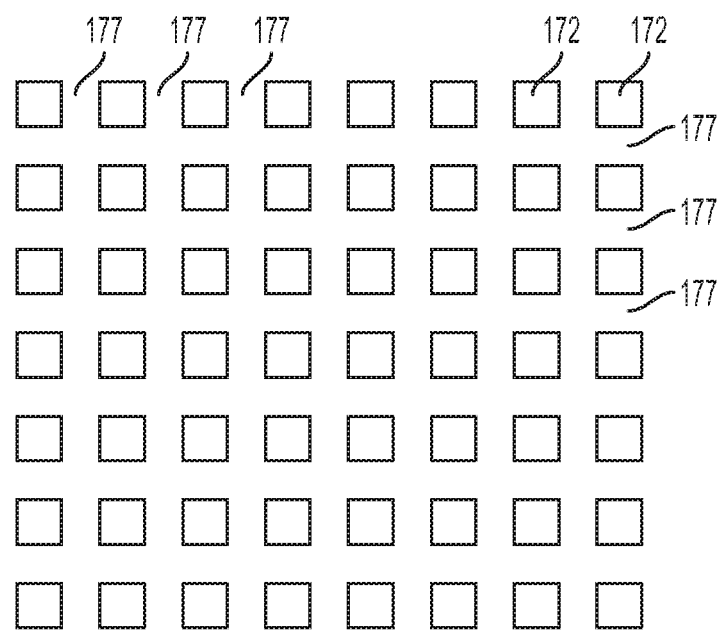

FIGS. 4B and 4C are top views of patterned layer 172 of FIG. 4A, in accordance with some embodiments. FIG. 4B includes trenches 177 being long and continuous trenches separating long and solid (and continuous) strips of N-type layer 172. FIG. 4C includes that long and continuous trenches 177 run in both X and Y directions. Trenches 177 separates islands of N-type layer 172. FIGS. 4B and 4C are two examples. Other configurations and top views of N-type layer 172 are also possible. The existence of the trenches 177 increases the surface area of N-type layer 172 to form P-N junction with subsequent P-type layer. The large P-N junction interface enables absorbing more light per pixel to produce electrical signals with higher intensity.

After N-type layer 172 is patterned, an organic P-type layer 173 is deposited over the patterned N-type layer 172. The organic P-type layer 173 is made of an organic semiconductor material. In some embodiments, the organic P-type layer 173 is made of a conjugated polymer. The example, applicable the conjugated polymers include thiophene-based conjugated polymer, such as poly(3-hyxylthiophene) (P3HT), benzodithiophene-based conjugated polymer, thieno[3,4-c]pyrrole-4,6-dione (TPD)-based conjugated polymer, diketo-pyrrole-pyrrole (DPP)-based conjugated polymer, bithiazole (BTz)-based conjugated polymers, benzothiadiazole (BT)-based conjugated polymer, thieno[3,2-b]thiophene (TT)-based conjugated polymer, or a combination thereof. In some embodiments, the organic P-type layer 173 is formed by mixing the selected conjugated polymer(s), such as P3HT and an aromatic solvent(s), such as toluene and/or 1,2-dichlorobenzene, and then stirring the mixture at an elevated temperature. In some embodiments, the elevated temperature is at about 600 C. The mixture of conjugated polymer(s) and solvent (in liquid form) is then applied, such as by spraying with a nozzle, on the surface of N-type layer 172. The solvent(s) is then driven out by evaporation. Since the mixture of the organic P-type materials, such as P3HT, and solvent(s) are in fluid form when it is applied on the surface of N-type layer 172, the mixture fills trenches 177 and leaves a substantially flat surface 178.

In some embodiments, a LUMO of P-type layer 173 is in a range from about 2.8 eV to about 3.6 eV and a HOMO of P-type layer 173 is in a range from about 4.5 eV to about 5.6 eV. The lower values, such as 2.8 eV and 4.0 eV are close to the work function of the pixel electrode layer 170 (cathode). The higher values, such as 4.5 eV and 5.6 eV, are close to the work function of an anode.

A thickness DP of the organic P-type layer 173 over the top surface of N-type layer 172 is in a range from about 20 nm to about 300 nm, as shown in FIG. 3 in accordance with some embodiments. The thickness DPT of the organic P-type layer 173 over the bottom surface of N-type layer 172 is in a range from about 30 nm to about 500 nm. The thickness of the P-type layer is adjusted with different types of organic P-type materials used. The P-type layer 173 and N-type layer 172 forms a P-N junction 180, which is an interface between a P-type and an N-type materials, of a photodiode.

Referring back to FIG. 3, after the organic P-type layer 173 is deposited, a hole transport (or electron blocking) layer 174 is deposited over the organic P-type layer 173, in some embodiments. The hole transport layer 174 has a work function that assists the transport of holes and blocks the transport of electrons. In addition, the hole transport layer 174 is transparent, which allows light (iso as shown in FIG. 2) to pass through and reach the P-N junction 180.

In some embodiments, the hole transport layer 174 is made of metal oxide, such as MoO3, WO3, NiO, CuO, V2O5, etc. Alternatively, the hole transport layer 174 is made of polymers, such as a combination of (poly(3,4-ethylenedioxythiophene):poly(styrenesulfonate) (PEDOT:PSS). A work function of the hole transport layer 174 is between the work function of the organic P-type layer 174 and the anode (to be described below).

In some embodiments, a LUMO of hole transport layer 174 is in a range from about 1.5 eV to about 3.0 eV and a HOMO of hole transport layer 174 is in a range from about 4.8 eV to about 5.6 eV. For example, the work function of PEDOT:PSS is about 5.0 eV. If a metal oxide, such as MoO3, WO3, NiO, CuO, V2O5, etc., is used for the hole transport layer 174, the hole transport layer is able to be deposited by physical vapor deposition (PVD), chemical vapor deposition (CVD), atomic layer deposition (ALD), or other applicable process. In some embodiments, a thickness of hole transport layer 174 is in a range from about 1 nm □m to about 20 nm. As mentioned above, the work function of layer 174 can be tuned, by choosing the material and by varying the thickness.

After the hole transport layer 174 is deposited, a transparent electrode layer 175 is deposited over hole transport layer 174. The transparent electrode layer 175 is transparent to allow light 150 to shine through and is conductive to function as an electrode. Examples of suitable materials for transparent electrode layer 175 include, but are not limited to, indium tin oxide (ITO), indium zinc oxide (IZO), indium gallium zinc oxide (IGZO), etc. In some embodiments, transparent electrode layer 175 is deposited by physical vapor deposition (PVD). However, other deposition processes, such as chemical vapor deposition (CVD) or atomic layer deposition (ALD), or other applicable processes, are possible.

In some embodiments, a thickness of transparent electrode layer 175 is in a range from about 50 nm to about 300 nm. In some embodiments, a work function of transparent electrode layer 175 is in a range from about 4.5 eV to about 5.5 eV. The work function of layer 175 can be tuned, by choosing the material and by varying the thickness.

As mentioned above, there are light-blocking structures 125 between photodiodes 135. After transparent electrode layer 175 is deposited, a patterning process is performed to remove layers, such as layers 170-175, between photodiodes 135. The patterning process includes forming a photoresist layer (not shown), with openings that correlate to isolation structures 125, and etching to remove a portion of the material layers of pixels wo under the openings. Afterwards, etching is completed, the remaining photoresist layer is removed. A non-transparent dielectric material is then deposited to fill the openings and to form light-blocking structures 125.

Figure 5:
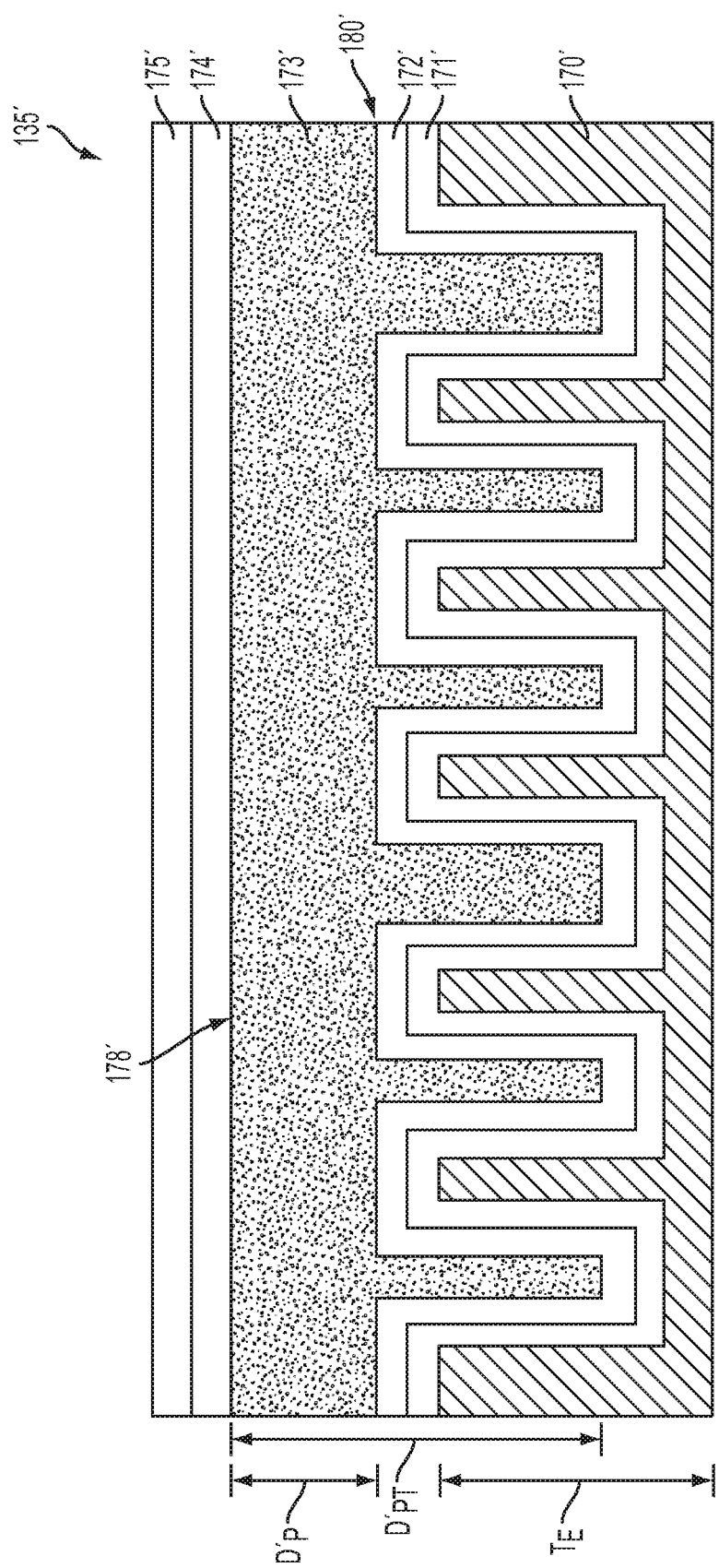
FIG. 5 is a cross-sectional view of a photodiode, in accordance with some embodiments.

FIG. 3 includes a pixel 100 with large P-N junction interface 180 due to the large surface area of the N-type layer 172. There are other mechanisms to produce large areas of P-N junction interface. FIG. 5 includes a cross-sectional view of a photodiode 135', in accordance with some embodiments. Photodiode 135' is similar to photodiode 135 described above. However, the large P-N junction interface 180' of photodiode 135' is created by forming trenches in the pixel electrode layer 170', instead of N-type layer 172 for photodiode 135, as shown in FIG. 5. FIG. 5 shows that photodiode 135' includes various layers, 170'-175' similar to layers, 170-175, of photodiode 135 of FIG. 3. However, the large surface of N-type layer 172' is created by forming trenches in pixel electrode layer 170'.

Figure 6A:
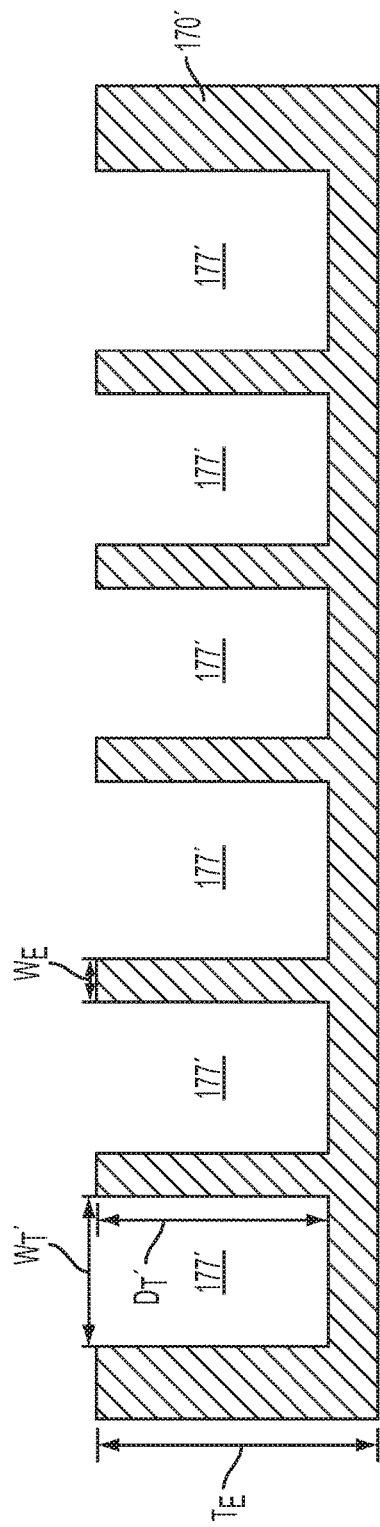
FIG. 6A is a cross-sectional view of an electrode layer of a photodiode with trenches, in accordance with some embodiments.

The material and function for pixel electrode layer 170' is similar to pixel electrode layer 170 described above. As described above, pixel electrode layer 170' is made of a conductive material and is formed over interconnect structures 126. Pixel electrode layer 170' forms the cathode of the photodiode of pixel 100. In some embodiments, a total thickness TE of electrode layer 170' is in a range from about wo nm to about 500 nm, in some embodiments. The thickness of layer 170' in the embodiment shown in FIG. 5 is larger than layer 170 in the embodiment shown in FIGS. 4A-4C. The material suitable for layer 170' has been described above. Layer 170' is patterned to form trenches 177', as shown in FIG. 6A. Widths WT of trenches 177' are in a range from about 50 nm to about 450 nm, in some embodiments. The widths WT of trenches 177' are equal in some embodiments. However, the widths WT' of trenches 177' vary among different trenches 177', in some embodiments. Depths DT' of trenches 177' are in a range from about 50 nm to about 450 nm. The depths DT' of trenches 177' are equal in some embodiments. However, the depths DT' of trenches 177' vary among different trenches 177', in some embodiments.

A width WE of the pixel electrode layer 170' between two neighboring trenches 177' is in a range from about 20 nm to about 1 µm, in some embodiments. After trenches 177' are formed in electrode layer 170', an electron transport layer 171' is formed over layer 170, in some embodiments. The electron transport layer 171' is similar to layer 171 described above in terms of its function and its material. In some embodiments, a thickness of electron transport layer 171' is in a range from about 0.1 nm to about 20 nm, in some embodiments.

Figure 6B:
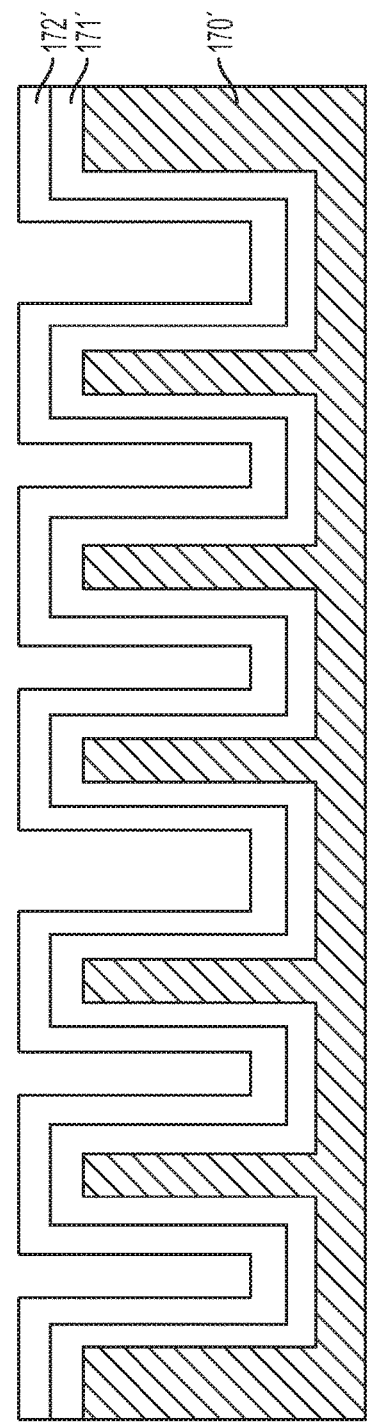
FIG. 6B is a cross-sectional view of an N-type layer and an electron transport layer over the electrode layer of FIG. 6A, in accordance with some embodiments.

Electron transport layer 171' covers the surface pixel electrode layer 170', including the surfaces of trenches 177', as shown in FIG. 6B in accordance with some embodiments. In some embodiments, electron transport layer 171' may be deposited by physical vapor deposition (PVD), chemical vapor deposition (CVD), atomic layer deposition (ALD), or other suitable methods. A deposition method that forms a conformal layer would be desirable. Electron transport layer 171' is omitted in some embodiments.

Afterwards, an N-type layer 172' is deposited over electron transport electron transport layer 171', or pixel electrode layer 170', if electron transport layer 171' does not exist. The N-type layer 172' is similar to N-type layer 172 described above. The N-type layer 172' and the subsequently deposited P-type layer form P-N junction photodiodes. A thickness of the N-type layer 172' is in a range from about 10 nm to about 100 nm, in accordance with some embodiments.

N-type layer 172' covers the surface electron transport layer 171', as shown in FIG. 6B in accordance with some embodiments. N-type layer 172' is deposited by physical vapor deposition (PVD), chemical vapor deposition (CVD), atomic layer deposition (ALD), or other suitable methods. A deposition method that forms a conformal layer would be desirable. Due to the formation of trenches 177' in the pixel electrode layer 170', the surface area of n-type layer 172' is much larger than a photodiode structure with flat layers and without forming trenches 177'.

After N-type layer 172' is deposited, an organic P-type layer 173' is deposited over the patterned N-type layer 172'. Organic P-type layer 173' is similar to organic P-type layer 173 described above. The P-type layer 173' fills the trenches between N-type layer 172' and leaves a substantially flat surface 178', as shown in FIG. 6A in accordance with some embodiments.

A thickness DP' of the organic P-type layer 173' over a top surface of N-type layer 172' is in a range from about 20 nm to about 300 nm. A thickness DPT' of the organic P-type layer 173' over a bottom surface of N-type layer 172' is in a range from about 30 nm to about 500 nm. The thickness of the P-type layer is adjusted with different types of organic P-type materials used. The P-type layer 173' and N-type layer 172' forms a P-N junction 180', which is an interface between a P-type and an N-type materials, of a photodiode.

After the organic P-type layer 173' is formed, a hole transport (or electron blocking) layer 174' is deposited over the organic P-type layer 173'. Hole transport layer 174' is similar to hole transport layer 174 described above. A transparent electrode layer 175' is then deposited over hole transport layer 174'. The transparent electrode layer 175' is similar to transparent electrode layer 175 described above.

Figure 6C:
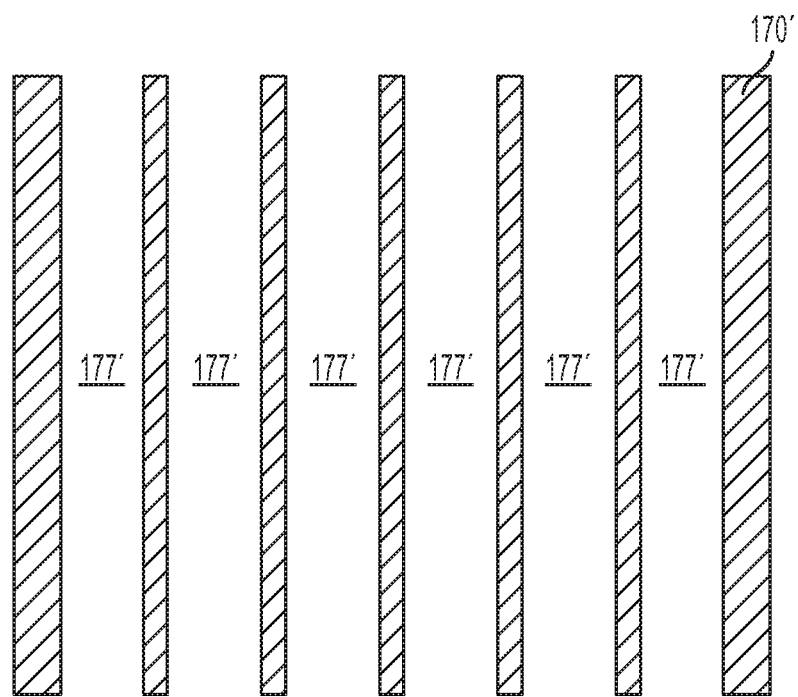
FIGS. 6C and 6D are top views of a patterned electrode layer of FIG. 6A, in accordance with some embodiments.
Figure 6D:
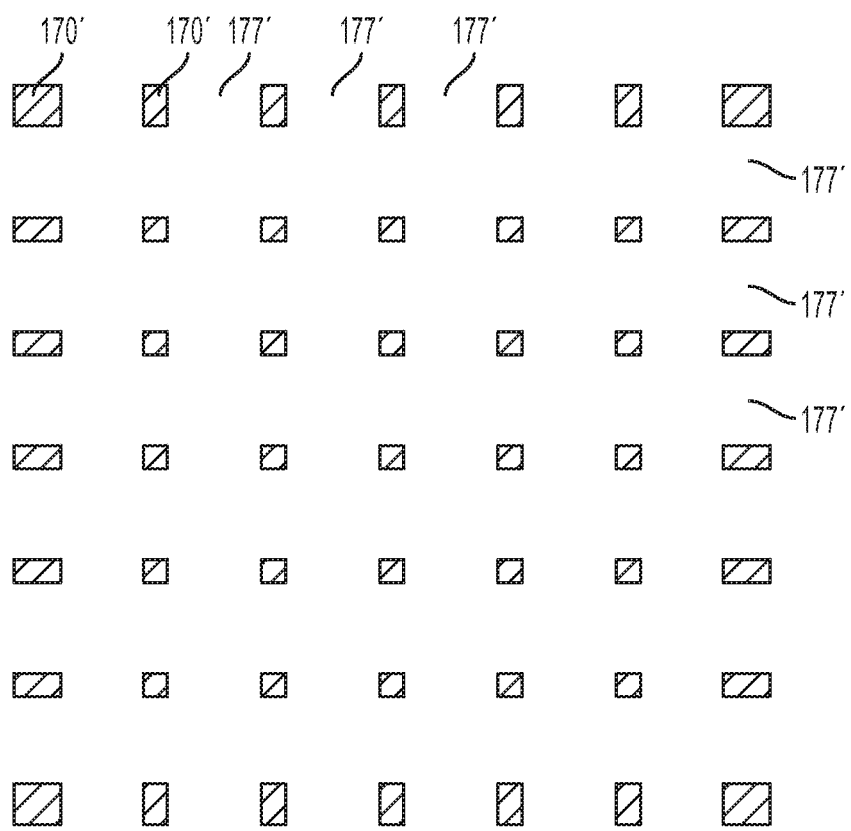

FIGS. 6C and 6D are top views of patterned pixel electrode layer 170' of FIG. 6A, in accordance with some embodiments. FIG. 6C includes trenches 177' being long and continuous trenches separating long and solid (and continuous) strips of layer 170'. FIG. 6D includes long and continuous trenches 177' that run in both X and Y directions. Trenches 177' separates islands of pixel electrode layer 170'. FIGS. 6C and 6D are two examples. Other configurations and top views of pixel electrode layer 170' are also possible. For example, the top view of top portion of layer 170' (islands) shows rectangular-shaped layer 170' in FIG. 6D. However, pixel electrode layer 170' of FIG. 6D could be shaped differently, such as circular, oval, or other applicable shapes. Similarly, the top view of top portion of pixel electrode layer 170' of FIG. 6C could be shaped differently. The islands of pixel electrode layer 170' do not need to be rectangular bars. The top view of the top portion of pixel layer 170' could be curvy bars, or in other shapes. Similar description of configurations can be made for n-type layer 172 of FIGS. 4B and 4C.

The existence of the trenches 177' increases the surface area of N-type layer 172' to form PN junction with P-type layer 173'. Similar to photodiode 135, photodiode 135' also has improved QE, over flat photodiodes. In some embodiments, the QE is improved in a range from about 20% to about 200%, as compared to photodiodes without trenches (or with flat surface), which has lower PN-junction interfacial area.

In addition to forming trenches in n-type layer 172 and pixel electrode layer 170', as described above, trenches may also be formed in the electron transport layer 171. The remaining processes involved in forming the photodiodes are similar to those described for photodiodes 135 and 135'.

In the embodiments described above, the organic photodiodes 135, 135' are used for image sensors. However, the organic photodiodes may also be used for other applications involving photodetectors.

Embodiments of forming an image sensor with organic photodiodes are provided. Trenches are formed in the organic photodiodes to increase the PN junction interfacial area, which improves the quantum efficiency (QE) of the photodiodes. The organic P-type material is applied in liquid form to fill the trenches. A mixture of P-type materials with different work function values and thickness are able to be used to meet the desired work function value for the photodiodes.

In accordance with some embodiments, a photodiode is provided. The photodiode includes a first electrode layer, and an N-type layer. A plurality of trenches is formed in the N-type layer. The photodiode also includes an organic P-type layer formed over the N-type layer, and the organic P-type layer fills the trenches in the N-type layer. The photodiode further includes a second electrode layer.

In accordance with some other embodiments, a photodiode is provided. The photodiode includes a first electrode layer, and an N-type layer. The N-type layer is formed over a first plurality of trenches. The photodiode also includes an organic P-type layer formed over the N-type layer, and the organic P-type layer fills the trenches in the N-type layer. The photodiode further includes a second electrode layer.

In accordance with yet some other embodiments, a front-side image sensor is provided. The front-side image sensor includes an organic photodiode with trenches at the interface between an N-type layer and an organic P-type layer. The front-side image sensor also includes a substrate with devices and interconnect structures, a color filter layer, and a micro-lens.

In accordance with an embodiment method of forming a photodiode, the method includes depositing an N-type layer over a first electrode layer. The N-type layer defines a plurality of trenches over the N-type layer including: first trenches having respective first lengths disposed in a first direction in a top-down view of the photodiode and second trenches having respective second lengths disposed in a second direction substantially perpendicular to the first direction in the top-down view of the photodiode. The method further includes depositing a P-type layer over the N-type layer in the plurality of trenches and depositing a second electrode layer over the P-type layer.

In accordance with an embodiment, a method includes patterning a plurality of trenches in a first electrode layer. The method also includes depositing a first doped layer extending along sidewalls and over bottom surfaces of the plurality of trenches. The method also includes depositing a second doped layer over the first doped layer and extending partially into the plurality of trenches. The first doped layer includes dopants of a different type than the second doped layer. The method also includes depositing a second electrode layer over the second doped layer.

In accordance with an embodiment, a method includes etching a plurality of trenches in a first electrode layer, depositing an electron transport layer over the first electrode layer and extending into the plurality of trenches, and depositing an N-type layer over the electron transport layer and extending into the plurality of trenches. The method also includes depositing a P-type layer over the N-type layer. An interface between the P-type layer and the N-type layer is disposed in multiple planes. The method further includes depositing a hole transport layer over the P-type layer and depositing a second electrode layer over the hole transport layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A photodiode comprising:
a first electrode layer, an entirety of the first electrode layer being conductive;
an N-type layer on a top surface and sidewalls of the first electrode layer, wherein the N-type layer defines:
a first N-type region;
a second N-type region, wherein a first virtual line extends through the first N-type region and the second N-type region in a top-down view; and
a third N-type region, wherein a second virtual line extends through the first N-type region and the third N-type region in the top-down view, the first virtual line being perpendicular to the second virtual line, both the first virtual line and the second virtual line being parallel to the top surface of the first electrode layer, wherein a planar surface of the first electrode layer extends continuously under the first N-type region, the second N-type region, and the third N-type region, the planar surface of the first electrode layer is opposite the N-type layer;

an organic P-type layer on the N-type layer, wherein the organic P-type layer surrounds each of the first N-type region, the second N-type region, and the third N-type region in the top-down view, and wherein the organic P-type layer is disposed between the first N-type region and the second N-type region in the top-down view and between the first N-type region and the third N-type region in the top-down view; and a second electrode layer on the organic P-type layer.

2. The photodiode of claim 1 further comprising an electron transport layer between the N-type layer and the first electrode layer.

3. The photodiode of claim 2, wherein the electron transport layer is disposed along sidewalls of the first electrode layer.

4. The photodiode of claim 1, wherein the N-type layer is disposed along sidewalls of the first electrode layer.

5. The photodiode of claim 1, wherein the organic P-type layer comprises:
a first surface forming an interface with the N-type layer; and
a second surface opposite the first surface, wherein the first surface of the organic P-type layer has a different profile than the second surface of the organic P-type layer.

6. The photodiode of claim 1 further comprising a transparent hole-transport layer between the organic P-type layer and the second electrode layer.

7. The photodiode of claim 1, wherein the second electrode layer comprises a transparent material.

8. The photodiode of claim 1, wherein the N-type layer further defines a fourth N-type region, wherein a third virtual line extends through the second N-type region and the fourth N-type region in the top-down view, the third virtual line being parallel to the second virtual line and parallel to the top surface of the first electrode layer, and wherein the organic P-type layer is disposed between the second N-type region and the fourth N-type region in the top-down view and between the third N-type region and the fourth N-type region in the top-down view.

9. A photodiode comprising:
a first electrode layer comprising:
a first region;
a second region physically separated from the first region; and
a third region connecting the first region to the second region;
an N-type layer, wherein the N-type layer extends along sidewalls of the first region of the first electrode layer, sidewalls of the second region of the first electrode layer, and over a top surface of the third region of the first electrode layer;
an organic P-type layer over the N-type layer, wherein the organic P-type layer extends along sidewalls of the first region of the first electrode layer, sidewalls of the second region of the first electrode layer, and over a top surface of the third region of the first electrode layer, wherein a continuously planar surface of the organic P-type layer extends from directly above the first region of the first electrode layer to directly above the second region of the first electrode layer, and the continuously planar surface of the organic P-type layer is opposite the N-type layer; and a second electrode layer over the organic P-type layer.

10. The photodiode of claim 9 further comprising a first conductive layer between the N-type layer and the first electrode layer.

11. The photodiode of claim 10, wherein the first conductive layer comprises LiF, TiO2, ZnO, Ta2O5, or ZrO2.

12. The photodiode of claim 10, wherein a highest occupied molecular orbital (HOMO) of the first conductive layer is in a range of 6.1 eV to 7.8 eV, and wherein a lowest occupied molecular orbital (LUMO) of the first conductive layer is in a range of 2.8 eV to 4.5 eV.

13. The photodiode of claim 9 further comprising a second conductive layer between the organic P-type layer and the second electrode layer.

14. The photodiode of claim 13, wherein a highest occupied molecular orbital (HOMO) of the second conductive layer is in a range of 4.8 eV to 5.6 eV, and wherein a lowest occupied molecular orbital (LUMO) of the second conductive layer is in a range of 1.5 eV to 3.0 eV.

15. The photodiode of claim 9, wherein a highest occupied molecular orbital (HOMO) of the N-type layer is in a range of 6.7 eV to 7.8 eV, and wherein a lowest occupied molecular orbital (LUMO) of the N-type layer is in a range of 3.7 eV to 4.5 eV.

16. The photodiode of claim 9, wherein a highest occupied molecular orbital (HOMO) of the organic P-type layer is in a range of 4.5 eV to 5.6 eV, and wherein a lowest occupied molecular orbital (LUMO) of the organic P-type layer is in a range of 2.8 eV to 3.6 eV.

17. The photodiode of claim 9, wherein the first electrode layer further comprises a fourth region on an opposing side of the first region as the third region, wherein a top surface of the first region is higher than a top surface of the third region by a first height, wherein the top surface of the first region is higher than a top surface of the fourth region by a second height, the first height being different than the second height.

18. An image sensor comprising:
an photodiode comprising:
an N-type layer, wherein the N-type layer comprises:
a first surface forming an interface with a P-type layer, the first surface being non-planar; and
a non-planar second surface opposite the first surface; and
the P-type layer over the N-type layer, wherein a surface of the P-type layer opposite the N-type layer is continuously planar and extends continuously over an entirety of the N-type layer;
interconnect structures electrically connecting the photodiode to devices of a substrate;
a color filter layer on an opposing side of the photodiode as the interconnect structures; and
a micro-lens on an opposing side of the color filter layer as the photodiode.

19. The image sensor of claim 18, wherein the photodiode further comprises a first electrode and second electrode, wherein the N-type layer and the P-type layer are disposed between the first electrode and the second electrode.

20. The image sensor of claim 19, wherein the photodiode further comprises:
 an electron transport layer between the first electrode and the N-type layer; and
 a hole transport layer between the second electrode and the P-type layer.

* * * * *